(12) United States Patent
Ilani

(10) Patent No.: US 11,152,958 B2
(45) Date of Patent: Oct. 19, 2021

(54) VERY LOW COMPLEXITY SECDED CODES

(71) Applicant: Western Digital Technologies, Inc., San Jose, CA (US)

(72) Inventor: Ishai Ilani, Dolev (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/909,794

(22) Filed: Jun. 23, 2020

(65) Prior Publication Data

US 2021/0175904 A1  Jun. 10, 2021

Related U.S. Application Data

(60) Provisional application No. 62/945,809, filed on Dec. 9, 2019.

(51) Int. Cl.
| | |
|---|---|
| *H03M 13/11* | (2006.01) |
| *H03M 13/00* | (2006.01) |
| *H03M 13/29* | (2006.01) |
| *H03M 13/15* | (2006.01) |

(52) U.S. Cl.
CPC .... *H03M 13/1174* (2013.01); *H03M 13/1168* (2013.01); *H03M 13/15* (2013.01); *H03M 13/2903* (2013.01); *H03M 13/616* (2013.01)

(58) Field of Classification Search
CPC ........ H03M 13/1174; H03M 13/2903; H03M 13/616; H03M 13/15; H03M 13/1168
See application file for complete search history.

(56) References Cited

U.S. PATENT DOCUMENTS

| | | | |
|---|---|---|---|
| 9,703,404 B2* | 7/2017 | Kimura ................. G06K 19/06 |
| 2007/0033483 A1* | 2/2007 | Jeong ..................... H03M 13/11 |
| | | | 714/758 |
| 2013/0166988 A1* | 6/2013 | Sharon ............... G06F 11/1012 |
| | | | 714/758 |
| 2017/0230059 A1* | 8/2017 | Giard ................ H03M 13/2927 |
| 2018/0102791 A1* | 4/2018 | Zhang ................... H04B 10/27 |
| 2018/0341543 A1* | 11/2018 | Ha ....................... H03M 13/3707 |
| 2019/0349128 A1* | 11/2019 | Zhou .................... H04L 1/0072 |
| 2020/0106459 A1* | 4/2020 | Gross ............... H03M 13/2906 |

* cited by examiner

*Primary Examiner* — Thien Nguyen
(74) *Attorney, Agent, or Firm* — Patterson & Sheridan LLP; Steven H. Versteeg

(57) ABSTRACT

A data storage device has a controller that is configured to generate SECDED codes based on a plurality (at least 2) of codes, where each of the constituent codes is a cyclic code over a finite field of size $2^m$ for some integer m. Any 2 constituent codes are associated with $2^{m1}$ and $2^{m2}$, where m1 and m2 are coprime (i.e., gcd(m1,m2)=1) where gcd is the greatest common divisor. In such a case, it is possible to generate a cyclic code of length $(2^{m1}-1)*(2^{m2}-1)$, which will be a long code, but enjoy the complexity, in encoding and decoding, of the small fields of the constituent codes.

20 Claims, 7 Drawing Sheets

VERY LOW COMPLEXITY SECDED CODES

CROSS-REFERENCE TO RELATED APPLICATIONS

This application claims benefit of U.S. Provisional Patent Application Ser. No. 62/945,809, filed Dec. 9, 2019, which is herein incorporated by reference.

BACKGROUND

Field of the Disclosure

Embodiments of the present disclosure generally relate to generating Single Error Correction Dual Error Detection (SECDED) codes based on a plurality of codes.

Description of the Related Art

SECDED codes are used to protect latency sensitive data. SECDED is applied to reliable media (i.e., DRAM), which does not typically suffer from errors, but may occasionally have single or even dual errors. Even though circuits for implementing SECDED codes are small, the encoding and decoding is fast and has low complexity, SECDED codes may appear multiple times in a system, and thus SECDED code's total size and power may not be negligible.

In pervious approaches, the information length, usually $2^a$ for some integer a, determines the field size $2^{a+1}$. A SECDED code would be designed by setting g(x) to be a primitive polynomial of degree a+1. Then, multiplying g(x) by (x+1) to receive a polynomial of degree r=a+2. The polynomial is then used for defining a cyclic code of length $2^{r-1}-1$. As the cyclic code is longer than the required code length (only $2^{r-2}$ information bits+r parity bits), the code may be shortened to the desired length.

For example, a SECDED code for protecting 128 bytes (=1024 bits) of information will use 12 bits of parity. In this application, encoding and decoding include field operations in a Galois Field $GF(2^{11})$. Encoding is done by multiplying the information vector by a matrix of size 12×1024, (or equivalent method). Decoding for a single error typically includes (on top of the matrix multiplication) a search along the full 128 bytes of information.

Therefore, there is a need for improving SECDED codes for long codes by operation over fields of lower dimension, and performing only a limited search in decoding.

SUMMARY

The present disclosure generally relates to generating SECDED codes based on a plurality (at least 2) of codes, where each of the constituent codes is a cyclic code over a finite field of size $2^m$ for some integer m. Any 2 constituent codes are associated with $2^{m1}$ and $2^{m2}$, where m1 and m2 are coprime (i.e., gcd(m1,m2)=1) where gcd is the greatest common divisor. In such a case, it is possible to generate a cyclic code of length $(2^{m1}-1)*(2^{m2}-1)$, which will be a long code, but enjoy the low complexity, in encoding and decoding, of the small fields of the constituent codes.

In one embodiment, a data storage device comprises a controller configured to: determine a first Galois Field $GF(2^{m1})$ and a second Galois Field $GF(2^{m2})$ for a codeword, wherein m1+m2+1=m and m is an integer; generate a single error correcting cyclic code of a first length; generate a SECDED cyclic code of a second length; generate a first binary matrix corresponding to the single error correcting cyclic code; generate a second binary matrix corresponding to the SECDED cyclic code; generate a parity check matrix; rotate the single error correcting cyclic code of the first length until an error is present in the parity portion of the code; and rotate the SECDED cyclic code of the second length until the error is present in the parity portion of the SECDED code.

In another embodiment, a data storage device comprises a memory device; and a controller coupled to the memory device, the controller configured to: generate two constituent codes of unequal length from a codeword of a first length; rotate at least one constituent code of the two constituent codes until an error within the at least one constituent code is present in a parity portion; determine a location of the error; and decode the codeword.

In another embodiment, a data storage device comprises: a memory device; and means to generate a cyclic code without codewords of weight 2 using CRT, wherein the means to generate are coupled to the memory device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
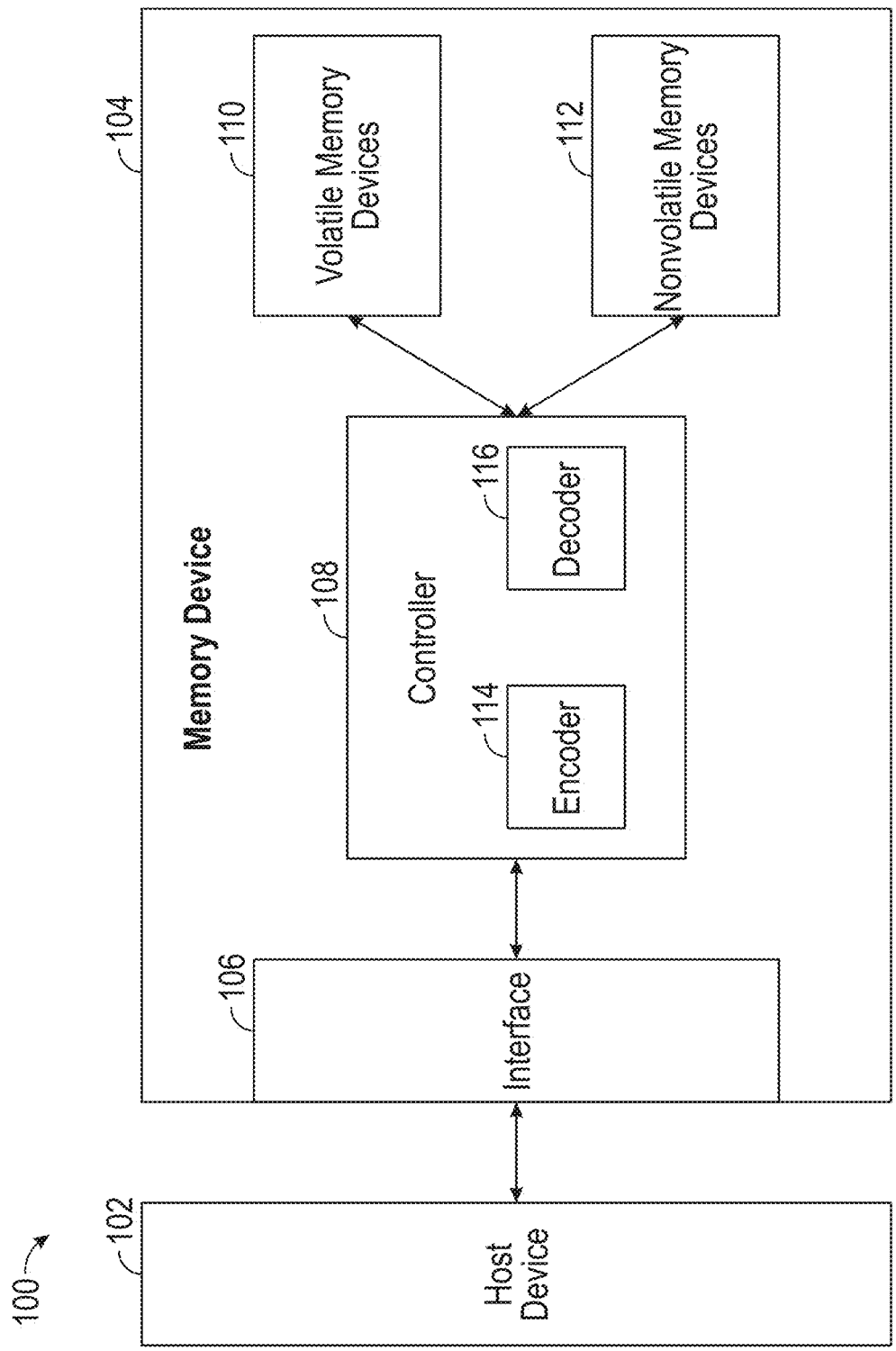
FIG. 1 is a schematic illustration of a data storage device.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to generating SECDED codes based on a plurality (at least 2) of codes, where each of the constituent codes is a cyclic code over a finite field of size $2^m$ for some integer m. Any 2 constituent codes are associated with $2^{m1}$ and $2^{m2}$, where m1 and m2 are coprime (i.e., gcd(m1,m2)=1) where gcd is the greatest common divisor. In such a case, it is possible to generate a cyclic code of length $(2^{m1}-1)*(2^{m2}-1)$, which will be a long code, but enjoy the low complexity, in encoding and decoding, of the small fields of the constituent codes.

Some notation before proceeding: 1) an "(n,k) code" is a code whose length is n, and the number of information bits is k, (i.e., the number of parity bits is r=n−k); 2) the weight (or Hamming weight) of a vector is the number of non-0 coordinates of the vector; 3) the syndrome (error syndrome) of a received vector, (relative to a code defined by a parity check matrix H), is the product of H with the vector. For vectors which are codewords of the code, the syndrome is 0

For example, a prior art common Single Error Correction Dual Error Detection (SECDED) code for protecting 64 bits implements a (127, 119) cyclic code based on a primitive polynomial of degree 7, e.g. $x^7+x+1$. Multiplying by x+1 results in a generating polynomial g(x) of degree 8 $g(x)=x^8+x^7+x^2+1$. The (127, 119) code is shortened to a (72, 64) code. Encoding and decoding operations involve 8 parity bits, which are computed by a matrix of size 8×64 and the decode operations require an additional matrix of size 8×8 which may be used in up to 9 iterations in order to search for an error over the full codeword (64+8 bits).

Alternatively the present disclosure uses the polynomials $g_A(x) \overset{\text{def}}{=} x^4+x^3+x^2+1$, and $g_B(x) \overset{\text{def}}{=} x^4+x+1$ which define cyclic codes of length $n_A$=7, and $n_B$=15, each with 4 parity bits, where the first code is a SECDED code, and the second code is a single error correction code. We use $g_A(x), g_B(x)$ to define a (105,97) cyclic code without codewords of weight 2. This is done by generating a first parity check matrix H1 of size 4×15 for the code associated with $n_B$, and generating a second parity check matrix H2 of size 4×7 for the code associated with $n_A$.

Then, an 8×(15*7) parity check matrix H for each cyclic code of length 105 is generated by concatenating 7 copies of H1 and placing them on top of a concatenation of 15 copies of H2.

$$H \overset{def}{=} \begin{pmatrix} \overbrace{H1 \; H1 \; \cdots \; H1}^{7} \\ \underbrace{H2 \; H2 \; \cdots \; H2}_{15} \end{pmatrix}$$

The code generated in this way is a SECDED code of (maximal) length 105, which is sufficient to hold 64 bits of information and 8 bits of parity. Thus, the code will occupy 72 coordinates and the remaining 33 coordinates will be shortened. Alternatively, H may be shortened by discarding the first 33 columns.

A single error may be corrected by decoding the code related to $g_A(x)$ to find the error location mod 7, and decode the code related to $g_B(x)$ to find the error location mod 15. The code related to $g_A(x)$ is a SECDED code, therefore the parity of the number of errors may be determined from the parity of the syndrome of that code. If the syndrome has even weight but not 0, then the number of errors >1 and the code returns a decoding failure.

If the syndrome is 0, but there are 2 errors, which may happen since the code associated with the concatenated matrix (H2 H2 . . . H2) includes codewords of weight 2, then, due to the CRT, the other syndrome will be non-0, so decoding failure will be declared in this case as well.

Another option for a SECDED code of length $15^2$=225, with 9 bits of parity capable of protecting 128 bits may be the following. Let H be the 4×15 parity check matrix defined by the companion matrix of $g_B(x)$, and let $I_{15}^1$ denote the circular shift one column to the right of the identity matrix $I_{15}$. Let $I_{15}^a \overset{\text{def}}{=} (I_{15}^1)^a$. Then the code defined by:

$$\begin{pmatrix} 1 & 1 & \cdots & 1 & 1 \\ H & H & \cdots & H & H \\ HI_{15}^{14} & HI_{15}^{13} & \cdots & HI_{15}^1 & H \end{pmatrix} \quad (1)$$

is a SECDED (225, 216) code, with 9 parity bits. Thus protecting 128 bits of information with the code of the parity check matrix (1) is a low complexity alternative to encoding via a 9×9 companion matrix. Strictly speaking, this code is not cyclic. However, it is closely related to cyclic codes, and may be encoded and decoded using slight variants of the algorithms used for cyclic codes.

Erasure codes are code designed for reconstructing the values of bits (or symbols) at known locations whose values are not known at the time of decoding. A typical example is in data centers where each symbol in a codeword is written to a different server, and at the time of decoding one or more of the servers are down due to maintenance or communication failures. Erasure codes may be designed using Reed-Solomon (RS) codes. So let $\alpha_r$ be a primitive element of a Galois Field GF($2^r$). According to the previous discussion, $\alpha_r$ may be realized as a r×r companion matrix, whose order is n$\overset{\text{def}}{=} 2^r-1$. An erasure code for correcting t erasures may be designed by the parity check matrix:

$$H_{rx} \overset{def}{=} \begin{pmatrix} I_r & I_r & \cdots & I_r & I_r \\ \alpha_r^{n-1} & \alpha_r^{n-2} & \cdots & \alpha_r & I_r \\ \vdots & \vdots & \vdots & \cdots & \vdots \\ \alpha_r^{(n-1)(t-1)} & \alpha_r^{(n-2)(t-1)} & \cdots & \alpha_r^{t-1} & I_r \end{pmatrix}. \quad (2)$$

Any j≤t columns of the matrix form a Vandermonde matrix, thus t parity symbols, (amounting to tr bits) are required for the code. In addition n servers are needed such that a server failure would affect just one symbol, and the total number of information bits protected by the code is (n−t)r.

In particular RAID6 requires correcting 2 erasures, so a RAID6 implementation may use the matrix $H_{r,2}$ comprised of the first 2 "rows" of $H_{r,t}$ as an erasure code with 2r bits of parity, i.e. the coding rate is 1-2/n.

If r is even, then the matrix $H_{r/2,2}$ defines an erasure code of length $2^{r/2}-1$ requiring r parity bits. Set:

$$I \stackrel{def}{=} I_{r/2}, I_{row} \stackrel{def}{=} \underbrace{(I, I, \ldots, I)}_{2^{r/2}-1} \qquad (3)$$

$$\alpha \stackrel{def}{=} \alpha_{r/2}, \alpha_{row} \stackrel{def}{=} \underbrace{\left(\alpha^{2^{r/2}-2}, \alpha^{2^{r/2}-3}, \ldots, \alpha, I\right)}_{2^{r/2}-1}.$$

Then the matrix:

$$H = \begin{pmatrix} I_{row} & I_{row} & \cdots & I_{row} & I_{row} \\ \alpha_{row} & \alpha_{row} & \cdots & \alpha_{row} & \alpha_{row} \\ \alpha^{2^{r/2}-2}\alpha_{row} & \alpha^{2^{r/2}-2}\alpha_{row} & \cdots & \alpha \cdot \alpha_{row} & \alpha_{row} \end{pmatrix} \qquad (4)$$

is an erasure code of length $(2^{r/2}-1)$ requiring only 1.5r parity bits. Decoding of 2 erasures may always be performed by either the first and second "rows" of H, or if the columns associated with the erasures are identical in the second "row", then use the first and third "row" are different, and may be used for decoding.

Turing now to an implementation of the CRT cyclic code implementation, FIG. 1 is a schematic illustration of a data storage device 100. The data storage device includes a host device 102 that communicates with a memory device 104 via an interface 106. The memory device 104 includes a controller 108 that communicates with the host device 102 via the interface 106. Both volatile memory devices 110 and nonvolatile memory devices 112 are coupled to the controller 108. The controller 108 includes an encoder 114 and a decoder 116. The data storage device 100 may be used to implement the CRT (Chinese Remainder Theorem) cyclic code decoding and encoding discussed herein.

Previous cyclic codes began with determining the information length L and the parity length p. Then, a Galois Field $GF(2^m)$ was chosen satisfying $N \stackrel{def}{=} 2^{m3}-1 \geq L+p$. By choosing the code in this manner, the code will not contain codewords of weight 2. However, all computations will be done in the large Galois Field $GF(2^m)$. In general, the computations are products of the form Av, where A is an m×m matrix, and v is an m dimensional vector.

Example

Figure 2A:
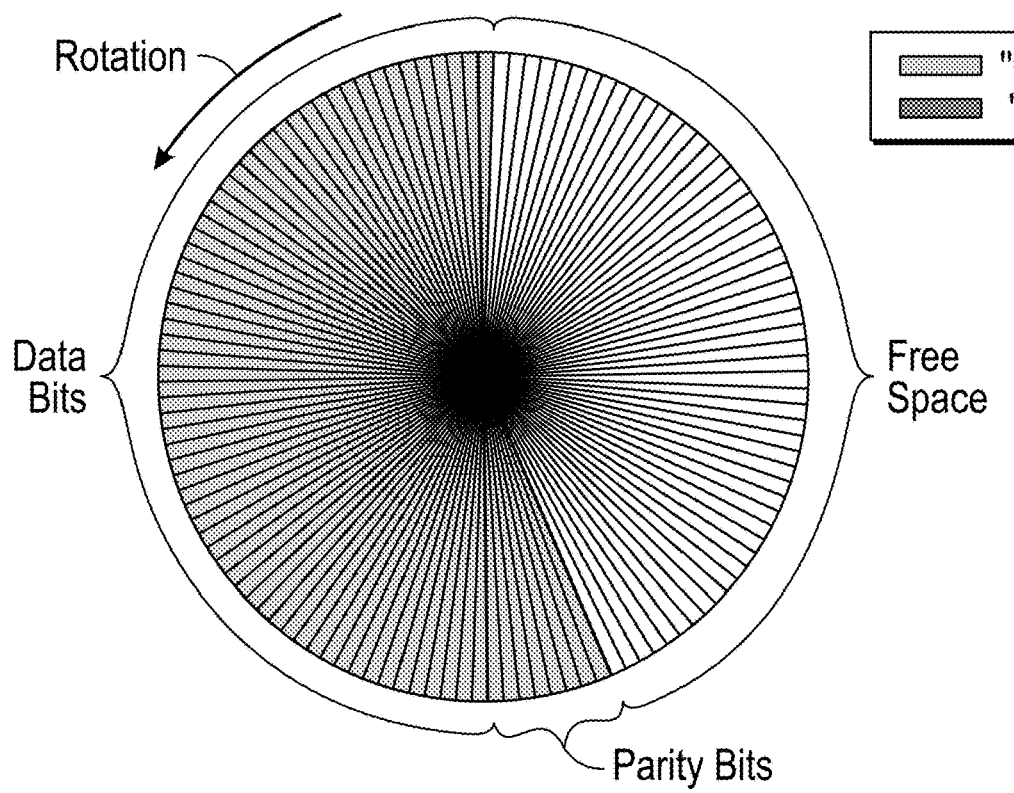
FIG. 2A is a schematic illustration of a SECDED code structure in a cyclic code arrangement.
Figure 2B:
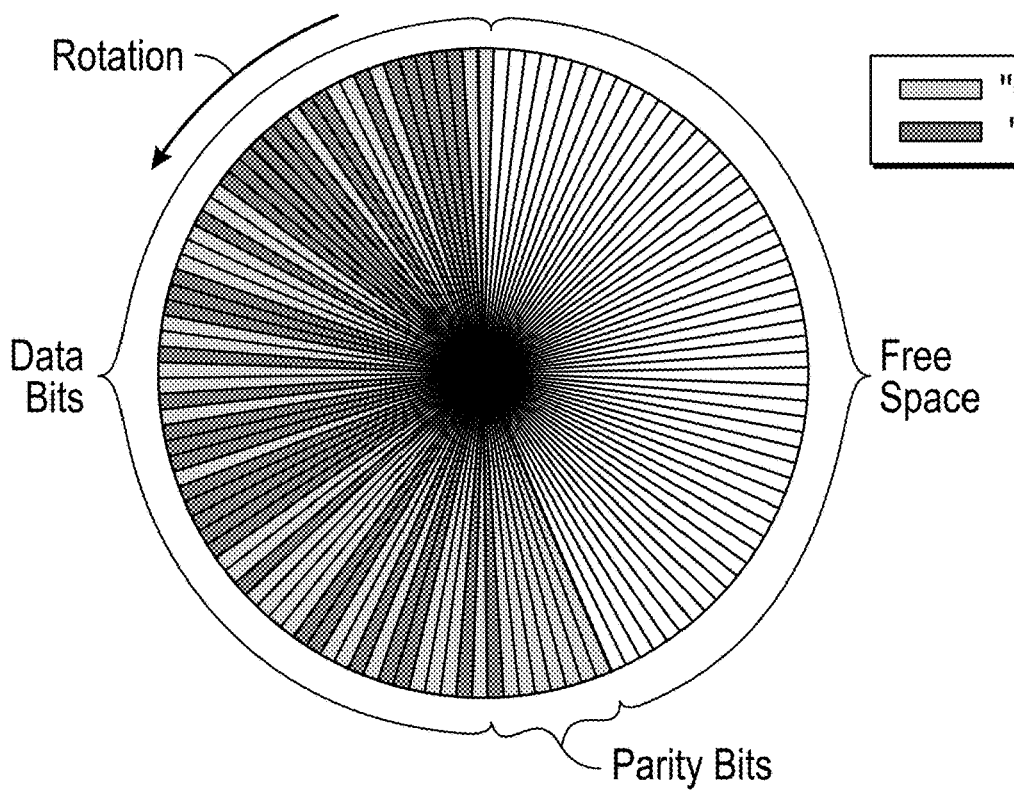
FIG. 2B is a schematic illustration of an original codeword in a cyclic code arrangement.
Figure 2C:
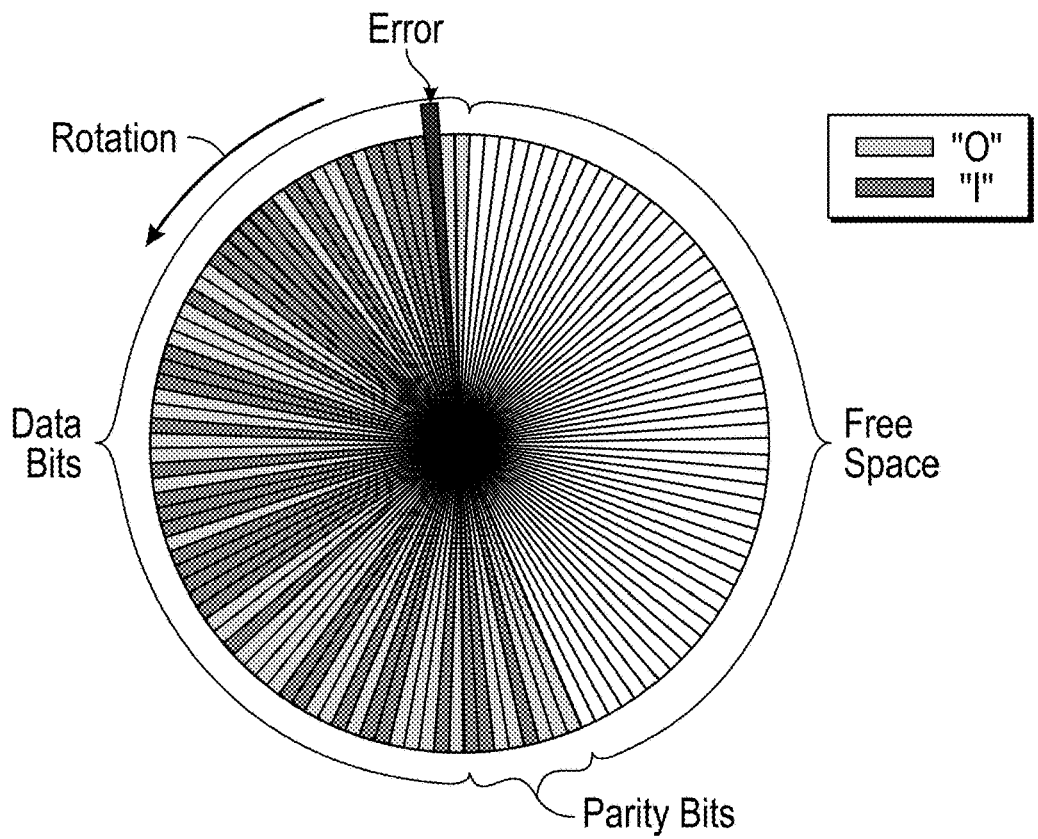
FIG. 2C is a schematic illustration of the original codeword in the cyclic code arrangement with a single error inserted.
Figure 2D:
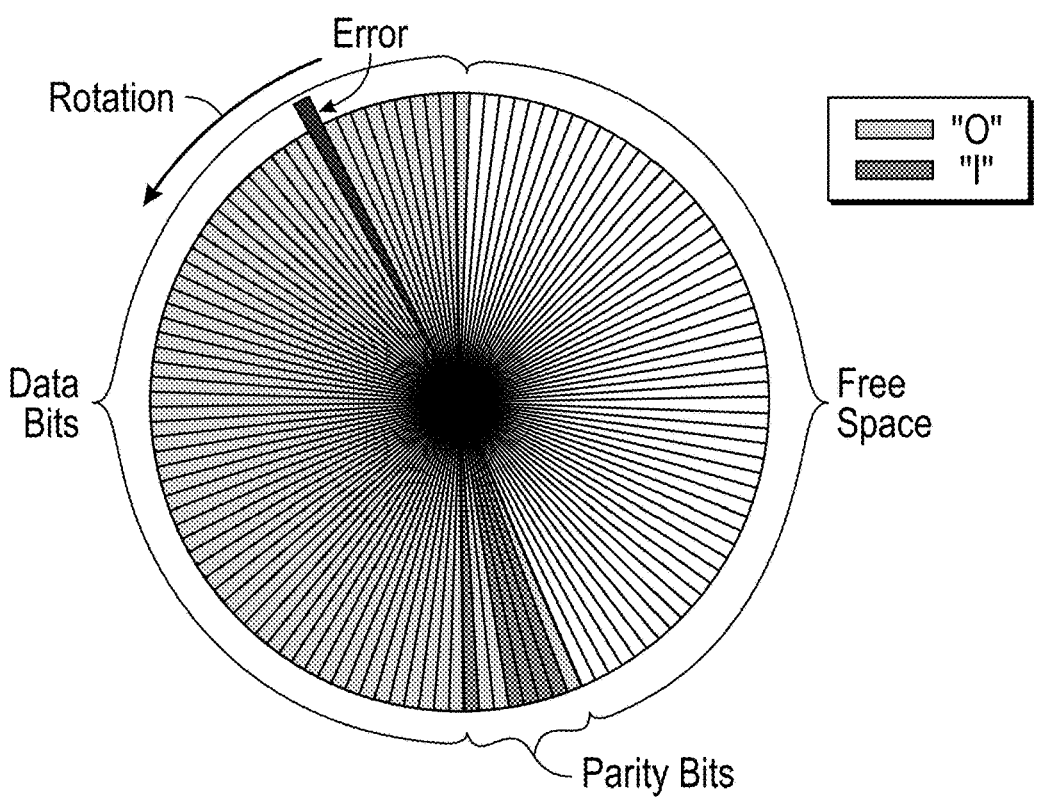
FIG. 2D is a schematic illustration of the original codeword in the cyclic code arrangement with the single error inserted after a first rotation.
Figure 2E:
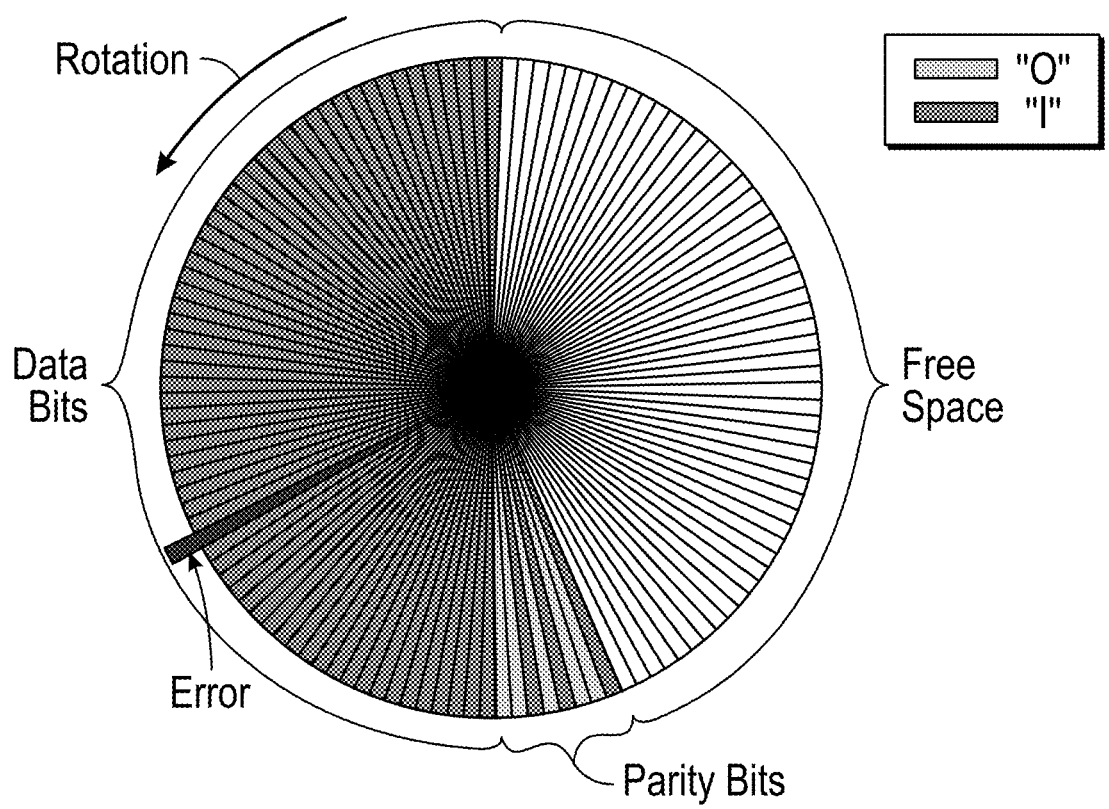
FIG. 2E is a schematic illustration of the original codeword in the cyclic code arrangement with the single error inserted after a fifth rotation.

This example involves a codeword with a length L of 64 with 8 parity bits p. To generate the polynomial:
L=64;
m1=7 (i.e., one less than the number of parity bits);
N=2^m1-1;
gPoly=genPrimPoly (m1)
% Make gPoly into a polynomial for a SECDED code
gPoly=mod(conv(gPoly, [1 1]), 2); (this makes the codewords even weight)
% Generate SECDED code
alpha=mod(compan(gPoly)', 2);
m=m1+1; % m=8 parity bits
alphaExpM=alpha^m;
rotateMat=inv(alphaExpM);
% Generate Parity Check Matrix
% H is the parity check of alpha
H=zeros(m, ceil(L/m+1)*m);
for k=0: ceil(L/m)
H(:, k*m+(1:m))=fliplr(alphaExpM^k)
End
% Cut H to the right dimensions and fliplr
H=fliplr(H(:, 1:(L+m)));
% Encode—this multiplies the message by the matrix (8 rows, 64 columns
Msg=randn(L, 1)>0;
parity=mod(H(:,1:L)*Msg, 2);
% Insert Error—this picks a random location and flips the bit
eLocation=randi(fix(L/4));
rMsg=Msg;
rMsg(eLocation)=mod(rMsg(eLocation)+1,2);
rParity=mod(H(:,1:L)*rMsg, 2);
errSyndrome=mod(parity+rParity, 2);

Turing now to a visual representation of the code structure, FIG. 2A is a schematic illustration of a SECDED code structure in a cyclic code arrangement. FIG. 2B is a schematic illustration of an original codeword in a cyclic code arrangement. FIG. 2C is a schematic illustration of the original codeword in the cyclic code arrangement with a single error inserted. FIG. 2D is a schematic illustration of the original codeword in the cyclic code arrangement with the single error inserted after a first rotation. FIG. 2E is a schematic illustration of the original codeword in the cyclic code arrangement with the single error inserted after a fifth rotation.

As shown in FIG. 2A, the SECDED code structure includes the information, parity, and shortening. More specifically, the capacity of the structure is 127. 64 bits are shown in the portion labeled "Data Bits" for the locations where the original codeword will be stored. 8 bits are shown in the portion labeled "Parity Bits" for the location of the parity bits. The portion labeled "Free Space" are bits not used and are simply the remaining capacity.

The codeword is initially arranged in the structure as shown in FIG. 2B. In the "Data Bits" portion, the light shading represents "0" for the data and the dark shading represents "1" for the data. In the "Parity Bits" portion, the light shading represents "0" for the parity, and the dark shading represents "1" for the parity. Decoding of the data is done by rotation, but first an error needs to be inserted into the codeword.

As shown in FIG. 2C, a single error is inserted into the codeword as shown in black shading. In the example, the error is inserted into the 2nd bit location. The data bit locations are numbered from the 1st light shading location as the 1st location and then continuing counterclockwise through the 64th location. The parity bit locations are 1-8 starting at the end of the data bit locations and continuing counterclockwise. In a decoding operation, the decoder does not know the location of the error, but for exemplification purposes, the error is at the 2nd bit location. It should be noted that the decoder computes the product of the parity check matrix H and the received word, which is known as the error syndrome. This product is equal to the product of the parity check matrix H and the unknown error vector. The error syndrome is placed in the parity portion of the code. At this stage the decoder does not know the location of the error. As shown in FIG. 2C, the parity portion has the 1st and 2nd parity bit locations as "1", the 3rd and 4th parity bit locations as "0", the 5th parity bit location as "1", and the 6th-8th parity bit locations as "0". Hence, there are three total "1" in the parity portion.

Now the decoder needs to figure out the location of the error, which is done by rotation. More specifically, the error is rotated until the error is located in the parity portion of the code (i.e., the "Parity Bits" portion). After each rotation, the error syndrome of the rotated error is computed, and placed in the parity portion of the code. When the error reaches the parity portion, the error syndrome will be all "0" except for a single bit location corresponding to the rotated error. The original error may then be computed from the location of the "1" in the error syndrome. Each rotation moves the error 8 coordinates closer to the parity section. The rotation is 8 coordinates because the parity section contains 8 bits. Thus, with 64 bits of data, a total of 8 rotations may be necessary to decode, where each rotation is actually computed as a product of an 8×8 matrix with an 8 dimensional vector. This is due the fact that rotating the error 8 positions to the right is equivalent to rotating the columns of the parity check matrix 8 positions to the left. Rotating the columns of H is done by multiplying H from the left by A-8 where A is the companion matrix of the generating polynomial.

FIG. 2D illustrates the location of the error after the first rotation where the error is now located in the $10^{th}$ bit location. For simplicity, the data bits, other than the inserted error, are all shown as "0". As can be seen from the parity portion after the first rotation, the parity portion has changed such that the $1^{st}$ parity bit is "1", the $2^{nd}$ and $3^{rd}$ parity bit locations are "0", and the $4^{th}$-$8^{th}$ parity bit locations are "1". Hence, there are five total "1" in the parity portion. This change is because the new parity bit locations (=new error syndrome) are the product of $A^{-8}$ and the previous error syndrome.

After five rotations, the error is now located in the $42^{nd}$ data bit location as shown in FIG. 2E, which is still not in the parity portion. Additionally, the parity portion now has the $1^{st}$ and $2^{nd}$ parity bit locations as "0", the $3^{rd}$ parity bit location as "1", the $4^{th}$ parity bit location as "0", the $5^{th}$ parity bit location as "1", the $6^{th}$ and $7^{th}$ parity bit locations as "0", and the $8^{th}$ parity bit location as "1". Hence, there are three total "1" in the parity portion. As can be understood, with a few more rotations, the error will be located within the parity portion. Once the error is in the parity portion, the party portion will be all "0" except for the error. The decoder thus knows that the error is in the one location that is not "0".

Knowing the location, and how many rotations occurred, the decoder now knows the location of the error in the codeword and can thus flip the error bit. A key point to note about the parity portion, if there is an even number of "1" in the parity portion, then there is an even number of errors. If there is an even number of errors, then the decoder fails. If there is an odd number of "1" in the parity portion, then there is an odd number of errors and hence, the decoder could potentially decode the data.

Understanding the above example, the present disclosure generates a cyclic code without codewords of weight 2, by methods related to CRT. Contrary to existing implementations of CRT within cyclic codes, the present disclosure uses CRT to generate a code whose length is larger than the length of the constituent codes.

Initially, two Galois Fields ($GF(2^{m1})$ and $GF(2^{m2})$) are determined such that gcd ($2^{m1}-1$, $2^{m2}-1$)=1 (in actuality, it is sufficient that gcd(m1,m2)=1). In the case of a SECDED code, it is additionally required that m1+m2+1=m. For the example, m1+m2+1=8. Therefore, select m1=4 and m2=3. Use the first Galois field ($GF(2^4)$) to generate a single error correcting cyclic code of length 15 (i.e., $2^4-1$), and use the second Galois Field ($GF(2^3)$) to generate a SECDED cyclic code of length 7 (i.e. $2^3-1$). Note that m1 and m2 do not need to be prime numbers, but simply have no common dividers. H1 will be the parity check matrix for m1, which is designed as a single error correction BCH code and is thus a 4×15 binary matrix. The number of rows of H1 corresponds to the number of parity bits which is m1 (i.e., 4), and the number of columns corresponds to the code length (i.e., 15). Similarly, H2 will be a parity check matrix for m2, which is designed as a SECDED code. Because H2 is SECDED, an additional parity bit is added. Therefore, H2 is a 4×7 binary matrix with m2 (i.e., 4) as the number of rows and the number of columns as the code length (i.e., 7). Note that at least one of the cyclic codes is a SECDED code.

The, 8×(15*7) parity check matrix H for each cyclic code of length 105 is generated by concatenating 7 copies of H1 and placing them on top of a concatenation copy of 15 copies of H2.

$$H \stackrel{def}{=} \begin{pmatrix} \overbrace{H1\ H1\ \cdots\ H1}^{7} \\ \underbrace{H2\ H2\ \cdots\ H2}_{15} \end{pmatrix}$$

The code generated in this way is a SECDED code of (maximal) length 105, which is sufficient to hold 64 bits of information and 8 bits of parity. Thus, the code will occupy 72 coordinates and the remaining 33 coordinates will be shortened. Alternatively, H may be shortened by discarding the first 33 columns. Another alternative parity check matrix H may be generated by setting H2 to be a parity check matrix for single error correction, (i.e. H2 will be a 3×7 parity check matrix). The H matrix describe by the scheme above is now a 7×105 matrix, (and not 8×105), and does not represent a SECDED code. If a row of 105 "1"-s will be added to the matrix H the result will be an 8×105 matrix which is a SECDED code.

A pseudo code for generating the two constituent codes is:

```
m1 = 4;
N1 = 2^m1-1;
gPoly1 = genPrimPoly (m1);
m2 = 3;
N2 = 2^m2-1;
gPoly2 = genPrimPoly (m2);
% Make gPoly2 into a polynomial for a SECDED code
gPoly2 = mod(conv(gPoly2, [1 1]), 2);
```

Figure 3:
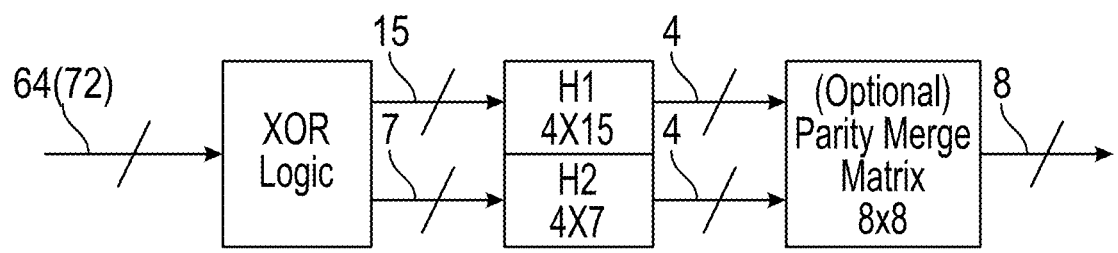
FIG. 3 is a schematic block diagram illustrating encoding according to one embodiment.

Both encoding and decoding are simpler for the newly generated code. First taking a look at encoding, because H1 is repeated 7 times in the upper part of the parity check matrix of the code, encoding may be performed by XORing bits whose location is the same mod 15, thus generating a 15 dimensional vector. Next, a matrix product of a 4×15 is performed on the generated vector to generate a first parity vector of dimension 4. Similarly, for the lower part, XORing bits whose location is the same mod 7, generating a 7 dimensional vector. A matrix product of a 4×7 is performed on the generated vector to generate a second parity vector of dimension 4. The 2 parity vectors may be input to an 8×8 matrix for merging the two parity vectors of the constituent codes into a parity vector of dimension 8 which is a parity vector of the code defined by H. Previous products required an 8×64 matrix on the data and thus the encoding is now much simpler. Looking at larger codes the difference between prior art codes and the current code are larger. FIG. 3 is a schematic block diagram illustrating encoding according to one embodiment.

At first the data bits, e.g. 64 bits are input to a XOR Logic unit. The XOR Logic unit computes the XOR of all bits whose locations are equal modulo the length of the first code (15 in the example) to generate a XOR1 vector of length equal to the length of the first code. In parallel, the XOR Logic unit computes the XOR of all bits whose locations are equal modulo the length of the second code (7 in the example) and generates a XOR2 vector of length equal to the length of the second code. The XOR1 vector is multiplied by H1 to generate a first syndrome, and the XOR2 vector is multiplied by H2 to generate a second syndrome. In some implementations the first syndrome and the second syndrome may be output as the parity bits of the code. Optionally the first and second syndromes may be multiplied by a Merge matrix to generate the parity bits of the code.

Figure 4A:
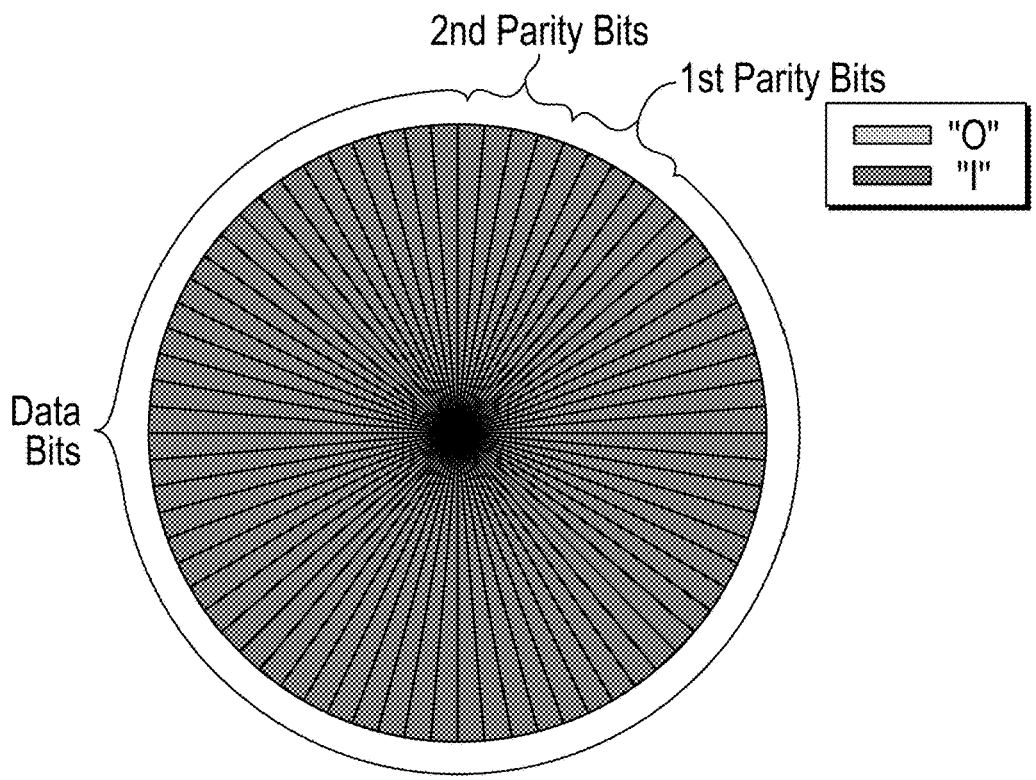
FIG. 4A is a schematic illustration of a SECDED code structure in a cyclic code arrangement according to one embodiment.

The bigger benefit of the disclosure is in decoding. FIG. 4A is a schematic illustration of a SECDED code structure in a cyclic code arrangement according to one embodiment. As shown in FIG. 4A, 64 data bit locations are shown in "Data Bits" portion; 4 parity bit locations are shown in "1st Parity Bits" portion; and 4 parity bit locations are shown in "2nd Parity Bits" portion. Each of the constituent codes, H1 and H2, is natively a small code (15 for H1, 7 for H2). Thus, the error syndrome of each of the codes (H1 H1 . . . H1), and (H2 H2 . . . H2) would not be associated with a single error, but rather with a coset of errors.

Figure 4B:
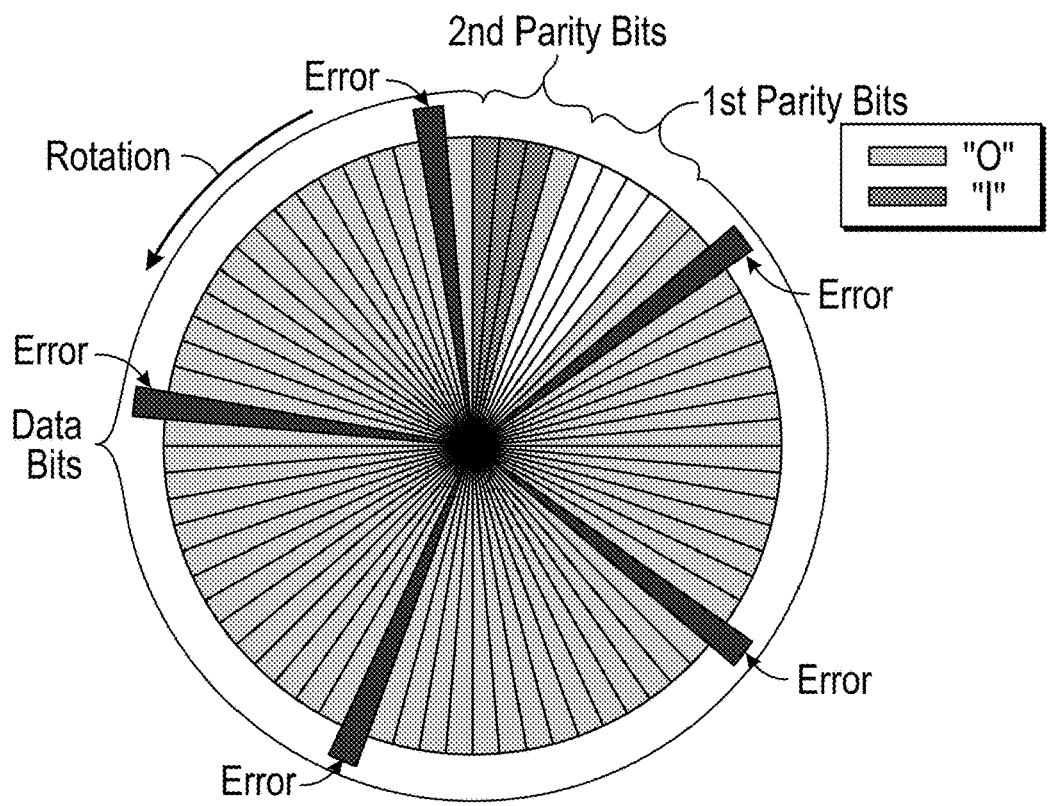
FIG. 4B is a schematic illustration of the first code error coset for FIG. 4A.

FIG. 4B is a schematic illustration of the first code error coset for FIG. 4A. As shown in FIG. 4B, the first error is located in the 2nd data bit location as in the example above. However, because the constituent code has a length of 15, the constituent code is repeated within the structure. Because the constituent code is repeated, the error is not completely determined from the error syndrome of the constituent code. The error may be located in the 2nd data bit location as well as the 17th data bit location, the 32nd data bit location, the 47th data bit location, and the 62nd data bit location. The first four parity bit locations are shown in the "1st Parity Bits" portion to represent the parity bit locations of the second constituent code. As shown in FIG. 4B, the 1st parity bit location for the first constituent code (i.e., the 5th parity bit location overall) is the light shading in the "2nd Parity Bits" portion and hence "0" while the 2nd-4th parity bit locations for the first constituent code (i.e., the 6th-8th parity bit locations overall) are "1".

On the one hand, H1 cannot determine the location of a single error. However, since the coset is large (i.e., 5 visible points in FIG. 4B), the number of rotations required until one of the error points enters the parity portion of the first constituent code (i.e., the "2nd Parity Bits" portion) is small. Moreover, each rotation is just a product of 4×4 matrix with 4 dimensional vector. The same may be done for H2 as will be discussed below, which will result in two coset representatives, one for each of the constituent codes. The CRT will ensure that the error location may be determined from the coset representatives. Here, since there are four parity bit locations, each rotation is just four bit locations counter-clockwise. Thus, the error that is in the 62nd data bit location prior to rotation will be in the parity portion in two rotations.

Figure 4C:
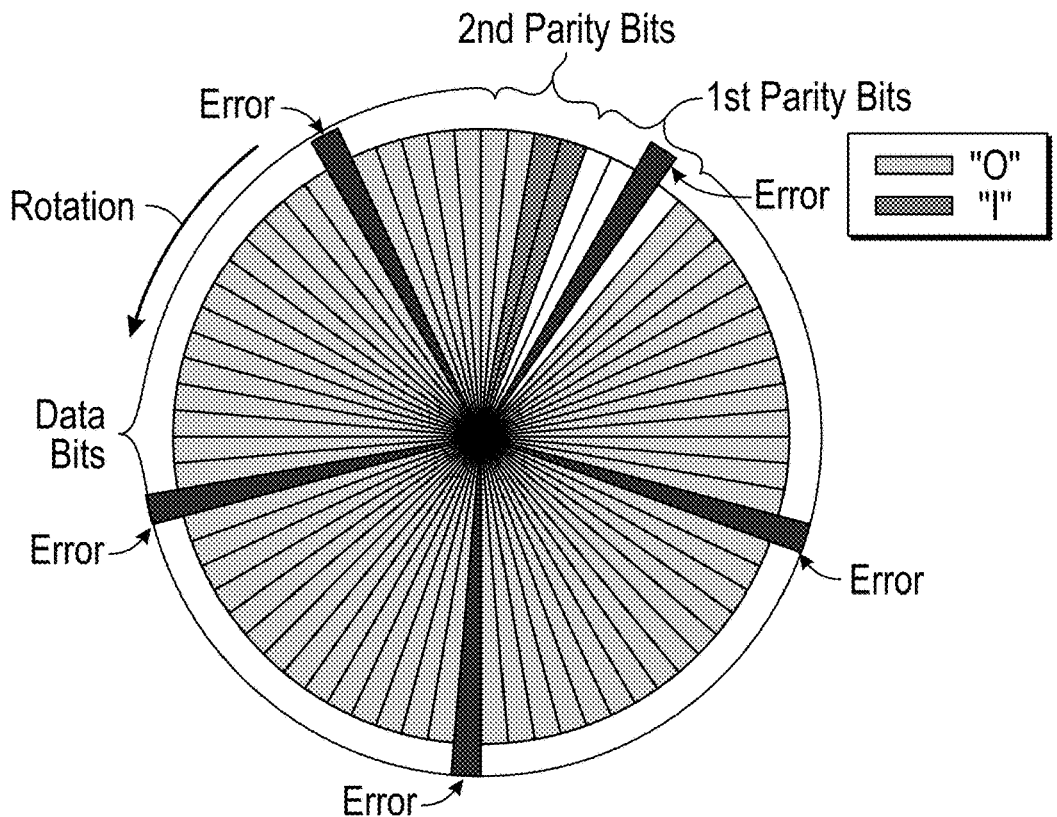
FIG. 4C is a schematic illustration of the first code error coset of FIG. 4A after the first rotation.

FIG. 4C is a schematic illustration of the first code error coset of FIG. 4A after the first rotation. As shown in FIG. 4C, the error that was in the 62nd data bit location prior to rotation has now been rotated to the "1st Parity Bits" portion, or more specifically, the 2nd parity bit location of the second constituent code and the 2nd parity bit location overall. The remaining errors have also moved to the 6th data bit location, the 21st data bit location, the 36th data bit location, and the 51st data bit location. The parity portion has now changed to the 1st and 2nd parity bit locations of the first constituent codeword (i.e., the overall 5th and 6th parity bit locations) being dark shaded within the "2nd Parity Bits" portion and hence "1" while the 3rd and 4th parity bit locations for the first constituent code (i.e., the overall 7th and 8th parity bit locations) being light shaded within the "2nd Parity Bits" portion and hence "0".

Figure 4D:
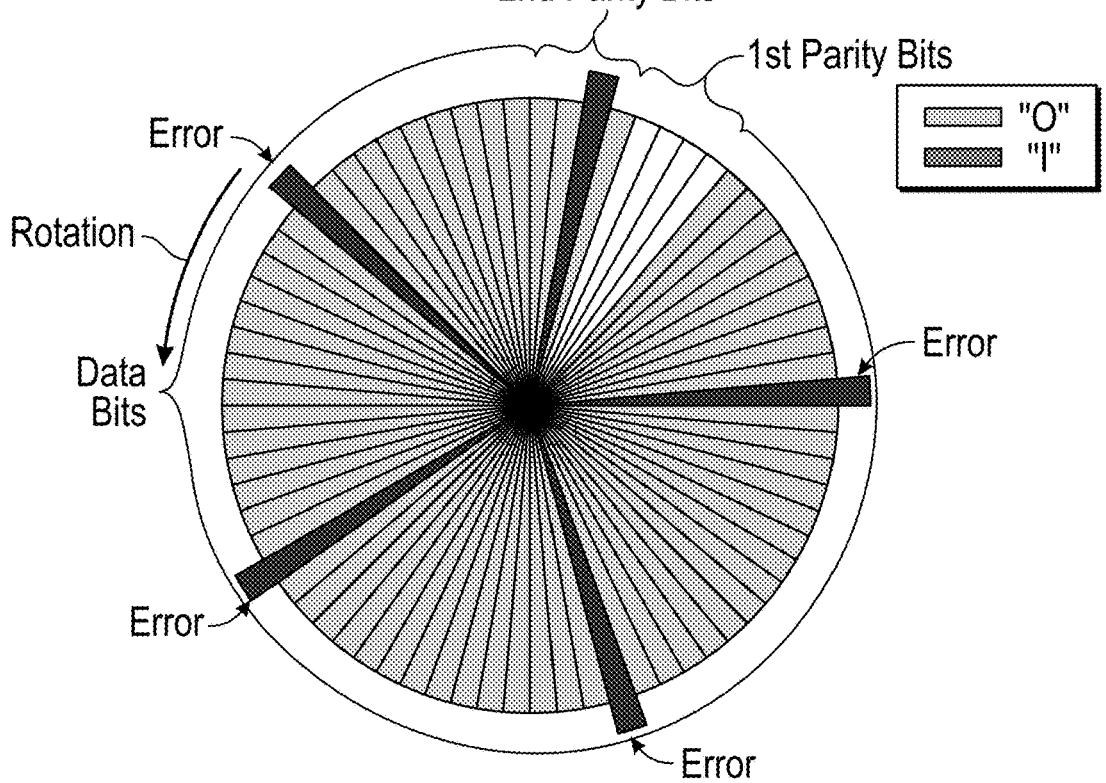
FIG. 4D is a schematic illustration of the first code error coset of FIG. 4A after a second rotation.

FIG. 4D is a schematic illustration of the first code error coset of FIG. 4A after a second rotation. As shown in FIG. 4D, the error is now located in the parity portion of the first constituent code. More specifically, the error is now located in the $2^{nd}$ parity bit location of the first constituent code (i.e., $6^{th}$ parity bit location overall). The parity portion now contains the error which will be "1" as well as "0" in the $1^{st}$, $3^{rd}$ and $4^{th}$ parity bit locations of the first constituent code (i.e., the $5^{th}$, $7^{th}$ and $8^{th}$ parity bit locations overall). Thus, there is a single "1" in the parity portion of the first constituent code, and the decoder can therefore likely decode. This "1" is in position 70 of the code, and since it was received after 2 rotations of 4, the decoder may deduce that the error position is in the coset which contains 62 (=70-8). This coset includes also 2, 17, 32, 47 and 62.

Figure 4E:
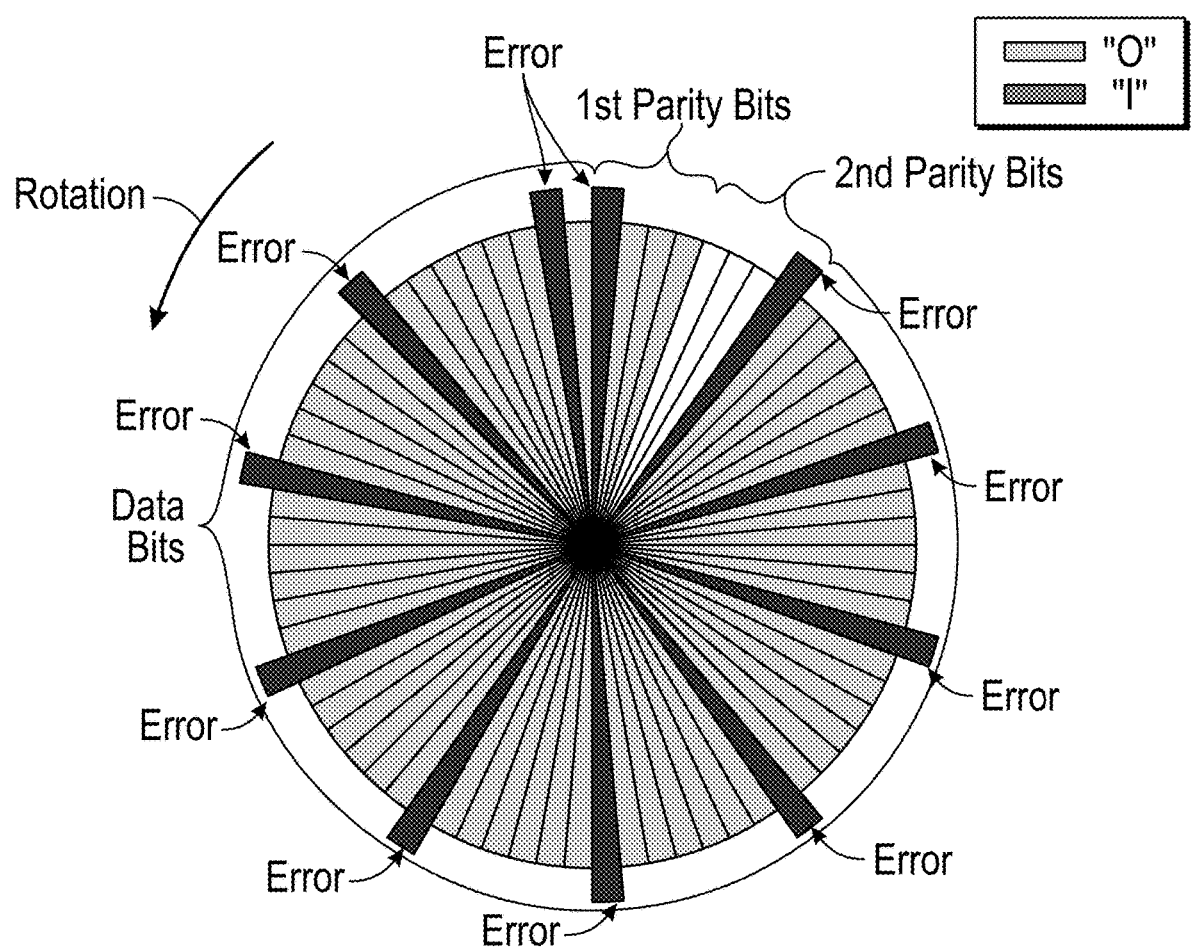
FIG. 4E is a schematic illustration of the second code error coset of FIG. 4A.

FIG. 4E is a schematic illustration of the second code error coset of FIG. 4A. As above, the error is located in the 2nd data bit location. However, because the constituent code has a length of 7, the constituent code is repeated within the structure. Because the constituent code is repeated, the error is hence repeated. The error may thus be located in the 2nd data bit location as well as the 9th data bit location, the 16nd data bit location, the 23rd data bit location, the 30th data bit location, the 37th data bit location, the 44th data bit location, the 51st data bit location, and the 58th data bit location. The first four parity bit locations are shown in the "2nd Parity Bits" portion to represent the parity bit locations of the first constituent code. As shown in FIG. 4E, the 1st-3rd parity bit locations for the second constituent code (i.e., the 5th parity bit location overall) are in the "1st Parity Bits" portion and hence "0" while the 4th parity bit location for the second constituent code (i.e., the 8th parity bit location overall) has the error and is hence "1". Furthermore, the error is already in the parity portion and thus, no rotation is necessary. The single "1" is located at position 72 of the code, and no rotation was performed. From this, the decoder may deduce that the error position is in the coset which contains 72. This coset includes also 2, 9, 16, 23, 30, 37, 44, 51, 58, 65 and 72.

Additionally, the reason that the error in the parity portion is shown so close to the error in the $2^{nd}$ data bit location is because the shortening portion of the code has not been included for simplicity.

After the two error cosets have been determined (i.e., FIGS. 4D and 4E), the error location can be computed. The CRT theorem ensures that each pair of coset representatives correspond to exactly one location. In the example the only location belonging to both error cosets is 2, which is the correct error location.

The discussion above focused on using the new code to correct a single error. The new code may also be used to identify two errors, which is thus a truly SECDED code. In the new code above, the H2 constituent code is a SECDED code, which means that the Hamming Weight of the parity portion (i.e., the number of non-0 coordinates) will be even if the Hamming Weight of the error is even, and the Hamming Weight of the parity portion will be odd if the Hamming Weight of the error is odd (i.e., either both are even or both are odd). If there are two errors, there are two possibilities. The first possibility is that the parity of H2 is not 0. For the first possibility, since the Hamming Weight of the parity is even and non-0, the codeword suffered from an even number of errors and is thus uncorrectable by the code. The second possibility is that the parity of H2 is 0. The second possibility may happen if 2 errors occurred in the same coset of H2. However, the errors will be in different cosets of H1, thus the parity of H1 will be non-0, and since the Hamming Weight of H2 is even (i.e. 0), the codeword suffered from an even number of errors and is thus uncorrectable by the code. Thus, the code can detect if there is an even number of errors, which is uncorrectable by the code. Thus, the new code is as functional as the original code, yet much simpler. Codes with multiple error correction capabilities may also be constructed by similar methods, but need more subtle computations to deal with issues of singly identifying the errors which are determined by the decoder.

It is to be understood that the example herein is for a small code of 64 bits of information with 8 bits of parity, but the same may be applied to larger codes as well. The benefits of the invention get larger with the code size. Additionally, it is to be understood that the disclosure has implementations beyond those discussed herein. Specifically, it is contemplated that the disclosure is applicable to communications, such as very high bandwidth fiber optic transmissions where high frequencies allow for very low complexity and low latency processing.

In one embodiment, a data storage device comprises a controller configured to: determine a first Galois Field $GF(2^{m1})$ and a second Galois Field $GF(2^{m2})$ for a codeword, wherein m1+m2+1=m and m is an integer; generate a single error correcting cyclic code of a first length; generate a SECDED cyclic code of a second length; generate a first binary matrix corresponding to the single error correcting cyclic code; generate a second binary matrix corresponding to the SECDED cyclic code; generate a parity check matrix; rotate the single error correcting cyclic code of the first length until an error is present in the parity check matrix; and rotate the SECDED cyclic code of the second length until the error is present in the parity check matrix. The rotating the single error correcting cyclic code of the first length rotates by a rotation amount equal to m1. Rotating the SECDED cyclic code of the second length rotates by a rotation amount equal to m2+1. In the data storage device, m is equal to a number of parity bits for the codeword. The parity check matrix is shortened by discarding a number of columns that is equal to a length of the codeword plus m. The first length is equal to $2^{m1}-1$. The second length is equal to $2^{m2}-1$. In the data storage device, m1 and m2 are different. The greatest common divisor for m1 and m2 is In another embodiment, a data storage device comprises a memory device; and a controller coupled to the memory device, the controller configured to: generate two constituent codes of unequal length from a codeword of a first length; rotate at least one constituent code of the two constituent codes until an error within the at least one constituent code is present in a parity portion; determine a location of the error; and decode the codeword. A greatest common divisor of: a length of a first constituent code of the two constituent codes; and a length of a second constituent code of the two constituent codes is equal to 1. At least one constituent code is a SECDED constituent code. The two constituent codes each have a length that is less than the first length. The controller is further configured to generate a parity matrix for a first constituent code of the at least one constituent code. The parity matrix has a number of rows that is equal to a number of parity bits for the first constituent code. The parity matrix has a number of columns that is equal to a length of the first constituent code. A number of parity bits for each constituent code is equal.

In another embodiment, a data storage device comprises: a memory device; and means to generate a cyclic code without codewords of weight 2 using CRT, wherein the means to generate are coupled to the memory device. The data storage device further comprises means to create a SECDED constituent code from a codeword. The cyclic code includes the SECDED constituent code and a second constituent code.

By using a much smaller field, all operations are simpler and have lower complexity. There is no need to rotate over a full codeword as the rotation described herein occurs over 2 smaller fields that requires a rotation only over a small portion of the code.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, the controller configured to:
retrieve a codeword from the memory device;
determine a first Galois Field $GF(2^{m1})$ and a second Galois Field $GF(2^{m2})$ for the codeword, wherein m1+m2+1=m and m is an integer;
generate a single error correcting cyclic code of a first length;
generate a SECDED cyclic code of a second length, wherein the second length is different from the first length;
generate a first binary matrix corresponding to the single error correcting cyclic code;
generate a second binary matrix corresponding to the SECDED cyclic code;
generate a parity check matrix;
rotate the single error correcting cyclic code of the first length until either an error is present in the parity check matrix or a first number of rotations has occurred, wherein the first number of rotations corresponds to a number of parity bits of the parity check matrix divided by a number of bits of data of the single error cyclic code;
rotate the SECDED cyclic code of the second length until either the error is present in the parity check matrix or a second number of rotations has occurred, wherein the second number of rotations corresponds to the number of parity bits of the parity check matrix divided by a number of bits of data of the SECDED cyclic code; and
upon determining a location of the error, flip a bit corresponding to the location.

2. The data storage device of claim 1, wherein the rotating the single error correcting cyclic code of the first length rotates by a rotation amount equal to m1.

3. The data storage device of claim 1, wherein rotating the SECDED cyclic code of the second length rotates by a rotation amount equal to m2+1.

4. The data storage device of claim 1, wherein m is equal to a number of parity bits for the codeword.

5. The data storage device of claim 1, wherein the parity check matrix is shortened by discarding a number of columns that is equal to a length of the codeword plus m.

6. The data storage device of claim 1, wherein the first length is equal to $2^{m1}-1$.

7. The data storage device of claim 6, wherein the second length is equal to $2^{m2}-1$.

8. The data storage device of claim 7, wherein m1 and m2 are different.

9. The data storage device of claim 8, wherein a greatest common divisor for m1 and m2 is 1.

10. A data storage device, comprising:
a memory device; and
a controller coupled to the memory device, the controller configured to:
retrieve a codeword from the memory device;
generate two constituent codes of unequal length from the codeword of a first length;
rotate at least one constituent code of the two constituent codes until either an error within the at least one constituent code is present in a parity portion or a number of rotations has occurred, wherein the number of rotations corresponds to a number of parity bits of the parity check matrix divided by a number of bits of data of the at least one constituent code;
determine a location of the error;
upon determining the location of the error, flip a bit corresponding to the location; and
decode the codeword.

11. The data storage device of claim 10, wherein a greatest common divisor of:
a length of a first constituent code of the two constituent codes; and
a length of a second constituent code of the two constituent codes is equal to 1.

12. The data storage device of claim 10, wherein at least one constituent code is a SECDED constituent code.

13. The data storage device of claim 10, wherein the two constituent codes each have a length that is less than the first length.

14. The data storage device of claim 10, wherein the controller is further configured to generate a parity matrix for a first constituent code of the at least one constituent code.

15. The data storage device of claim 14, wherein the parity matrix has a number of rows that is equal to a number of parity bits for the first constituent code.

16. The data storage device of claim 15, wherein the parity matrix has a number of columns that is equal to a length of the first constituent code.

17. The data storage device of claim 10, wherein a number of parity bits for each constituent code is equal.

18. A data storage device, comprising:
a memory device;
means to retrieve codewords from the memory device;
means to generate a cyclic code with the codewords of an odd integer weight using Chinese Remainder Theorem (CRT), wherein the means to generate are coupled to the memory device;
means to determine a location of an error in the cyclic code; and
upon determining the location of the error, means to flip a bit corresponding to the location.

19. The data storage device of claim 18, further comprising means to create a SECDED constituent code from the codewords of the odd integer weight.

20. The data storage device of claim 19, wherein the cyclic code includes the SECDED constituent code and a second constituent code.

* * * * *